(12) United States Patent
Liu et al.

(10) Patent No.: US 10,375,834 B1
(45) Date of Patent: Aug. 6, 2019

(54) 3D PRINTING WITH COMPONENTS EMBEDDED

(71) Applicant: Flextronics AP, LLC, Broomfield, CO (US)

(72) Inventors: Weifeng Liu, Dublin, CA (US); Murad Kurwa, San Jose, CA (US)

(73) Assignee: Flextronics AP, LLC., Broomfield, CO (US)

( * ) Notice: Subject to any disclaimer, the term of this patent is extended or adjusted under 35 U.S.C. 154(b) by 914 days.

(21) Appl. No.: 14/468,268

(22) Filed: Aug. 25, 2014

Related U.S. Application Data

(60) Provisional application No. 61/870,582, filed on Aug. 27, 2013.

(51) Int. Cl.
*H01K 3/10* (2006.01)
*H05K 3/30* (2006.01)
*H05K 13/04* (2006.01)
*H05K 3/40* (2006.01)

(52) U.S. Cl.
CPC ........... *H05K 3/305* (2013.01); *H05K 3/4007* (2013.01); *H05K 13/04* (2013.01); *H05K 2003/4023* (2013.01); *H05K 2203/0104* (2013.01)

(58) Field of Classification Search
CPC ...... H05K 3/305; H05K 13/04; H05K 3/4007; H05K 2003/4023; H05K 2203/0104; H01L 21/485; H01L 21/4857; Y10T 29/4913; Y10T 29/49155; Y10T 29/49163; Y10T 29/49165

USPC .......... 29/830, 832, 846, 851, 852; 174/262; 700/119, 123; 438/149
See application file for complete search history.

(56) References Cited

U.S. PATENT DOCUMENTS

| | | | | |
|---|---|---|---|---|
| 5,434,751 A * | 7/1995 | Cole, Jr. | ............... | H01L 21/485 29/846 |
| 5,865,918 A | 2/1999 | Franklin | | |
| 6,442,323 B1 | 8/2002 | Sorosiak | | |
| 6,697,694 B2 | 2/2004 | Mogensen | | |
| 6,905,569 B2 | 6/2005 | Kim | | |
| 6,997,698 B2 * | 2/2006 | Silverbrook | ............ | B22F 3/008 700/119 |
| 7,405,134 B2 * | 7/2008 | Yudasaka | .......... | H01L 21/02532 438/149 |
| 7,409,977 B2 | 8/2008 | Rice | | |
| 7,633,765 B1 * | 12/2009 | Scanlan | .............. | H01L 21/4857 174/262 |

(Continued)

FOREIGN PATENT DOCUMENTS

| | | |
|---|---|---|
| JP | 60026308 A | 2/1985 |
| WO | 20120465921 A1 | 12/2012 |

OTHER PUBLICATIONS

Non-Final Office Action dated Jul. 31, 2018, U.S. Appl. No. 14/958,603, filed Dec. 3, 2015, Applicant: Michael Jame Glickman, 16 pages.

*Primary Examiner* — Donghai D Nguyen
(74) *Attorney, Agent, or Firm* — Haverstock&Owens LLP

(57) ABSTRACT

Methods of and devices for using additive processes (e.g., 3D printing) to embed components inside an object are disclosed. In some embodiments, the components include active components, such as computer chips. In other embodiments, the components include passive components, such as inductor, resistor, and capacitors. The methods and devices disclosed herein can be used for rapid prototyping and fast manufacturing.

10 Claims, 9 Drawing Sheets

(56) References Cited

U.S. PATENT DOCUMENTS

| | | | |
|---|---|---|---|
| 7,793,411 B2 * | 9/2010 | Shintate | B32B 37/1292 |
| | | | 29/832 |
| 8,033,312 B2 | 10/2011 | Fries | |
| 8,098,408 B2 | 1/2012 | Sawada | |
| 8,110,057 B2 | 2/2012 | Rice | |
| 8,882,955 B2 | 11/2014 | Brandon | |
| 9,579,829 B2 | 2/2017 | Williams | |
| 10,016,942 B2 | 7/2018 | Mark | |
| 2004/0265593 A1 | 12/2004 | Kamijo | |
| 2008/0074697 A1 | 3/2008 | Sawada | |
| 2012/0305638 A1 | 12/2012 | Szesko | |
| 2013/0011629 A1 | 1/2013 | Brandon | |
| 2016/0136885 A1 | 5/2016 | Nielsen | |
| 2016/0136887 A1 | 5/2016 | Guillemette | |

* cited by examiner

3D PRINTING WITH COMPONENTS EMBEDDED

CROSS-REFERENCE TO RELATED APPLICATION(S)

This application claims priority under 35 U.S.C. § 119(e) of the U.S. Provisional Patent Application Ser. No. 61/870,582, filed Aug. 27, 2013 and titled, "3D PRINTING WITH COMPONENTS EMBEDDED," which is also hereby incorporated by reference in its entirety for all purposes.

FIELD OF THE INVENTION

The present invention relates to the field of manufacturing. More specifically, the present invention relates to 3D printing assisted manufacturing.

BACKGROUND OF THE INVENTION

Typical embedding electronic components in PCB (printed circuit board) requires complicated processes, including cutting holes on the PCB, attaching the components, and sealing the holes, which are time consuming and costly. Further, typical package and silicon integration are done at the packaging and not at the product level. There are numerous limitations in the numbers of components that can be integrated, which also requires intensive equipment costs.

SUMMARY OF THE INVENTION

Methods of and devices for using additive processes (e.g., 3D printing) to embed components inside an object are disclosed. In some embodiments, the components include active components, such as computer chips. In other embodiments, the components include passive components, such as inductors, resistors, and capacitors. The methods and devices disclosed herein can be used for rapid prototyping and fast manufacturing.

The methods of and devices for 3D printing with embedded components disclosed here provide an opportunity to make final products in one integrated design and manufacturing process. The methods disclosed herein can combine with other technologies, such as conductive ink printing, laser drilling, mechanical drilling, electroless/electrolytic plating, laser sintering or laser direct structuring. The methods and devices disclosed herein provide processes for rapid prototyping from CAD drawing to final products. The methods disclosed herein also provides a solderless process, which avoids the drawbacks of using solder processes.

The process disclosed here is able to make interconnections between the components through ink printing and sintering process. The process is also able to make through holes, blind via, buried via, via stackup, and other structures. In some embodiments, the products can be covered by the printing material, conformal coating or solder mask as a protection layer for the circuitry.

In an aspect, a method of making an electronic board comprises coupling one or more electronic components to a base layer and additive printing on the one or more electronic components. In some embodiments, the additive printing comprises 3D printing. In other embodiments, a base layer is formed by using the additive printing. In some other embodiments, a base layer is formed by layer-by-layer printing. In some embodiments, the electronic components comprise one or more computing chips. In other embodiments, the coupling comprises attaching using an adhesive. In some other embodiments, the method further comprises forming a conductive path pattern. In some embodiments, the conductive path pattern is formed by printing. In other embodiments, the printing comprises using an electrically conductive ink. In some other embodiments, the method further comprises forming one or more holes by the additive printing. In some embodiments, the method further comprises depositing metals in the one or more holes. In other embodiments, the method further comprises forming holes by drilling.

In another aspect, a method of making a circuit with embedded metal stud bumps comprises printing a first layer, attaching one or more electronic components with one or more metal stud bumps to the first layer, and printing a second layer to embed the one or more electronic components while exposing one or more metal stud bumps. In some embodiments, the method further comprises forming one or more conductive paths. In other embodiments, the one or more conductive paths are formed by printing. In some other embodiments, the printing comprises using an electrically conductive ink.

In another aspect, a system for making a device with one or more embedded components comprises an additive printer and an electronic component attaching device, wherein the electronic component attaching device couples one or more electronic components to a layer of material printed by the additive printer. In some embodiments, the one or more electronic components attaches to the layer of material. In other embodiments, the layer of material is a bottom layer of an electronic device. In some other embodiments, the system further comprises a second layer of material printed by the additive printer on top of the one or more electronic components. In some embodiments, the system further comprises a conductive path printed on a surface layer of the second layer.

In another aspect, a method of additive manufacturing comprises printing a first layer of a first polymer, attaching an electronic component to the first layer, and embedding the electronic component by a second layer. In some embodiments, the second layer is formed by additive printing. In other embodiments, the additive printing forms one or more holes by printing. In some other embodiments, the method further comprises the holes with filling nanoparticles. In some embodiments, the nanoparticles forms a conductive path. In other embodiments, the second layer comprises a water soluble polymer.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
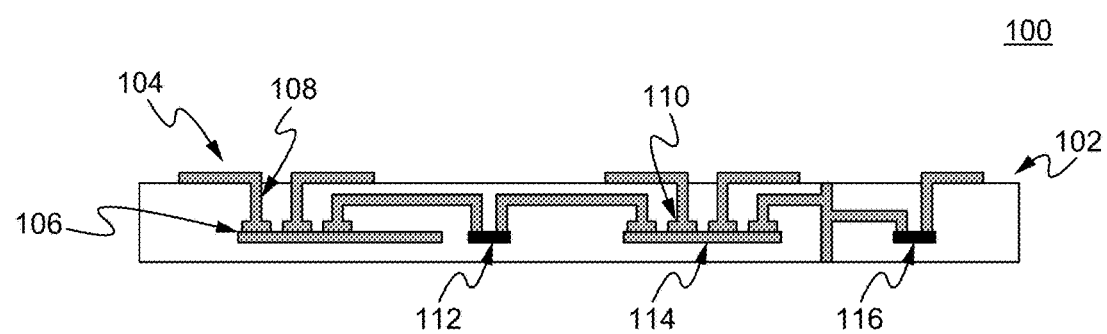
FIG. 1 illustrates an electronic system made by a 3D printing process with embedded components in accordance with some embodiments of the present invention.

FIG. 1 illustrates an electronic system 100 made by a 3D printing process with embedded components in accordance with some embodiments of the present invention. The system 100 can comprise a substrate 102. The system 100 can be made by a layer by layer printing process combined with laser or mechanical drilling processes to form vias or apertures. The printing process can be used along with the process of conductive ink printing, via filling, electrolytic or electroless printing to form one or more conductive paths, which are able to be used in signal/power transmission devices. Electronic components/structures are able to be embedded in the printing layers. For example, the system 100 comprises conductive traces 104 and via 108 on an integrated circuit chip 106, which is electrically coupled with a cap/resistor 112 and another integrated circuit chip 114. The integrated circuit chip 114 can comprise a pad 110 on chip 114 and couple with the cap/resister 116. The pads 110 can be copper, copper plated with nickel gold, silver, gold, and/or solder. In some embodiments, the polymers used for the 3D printing are in compliance with electronic system requirements, such as international standards or IEEE (Institute of Electrical and Electronics Engineers) standards.

Figure 2:
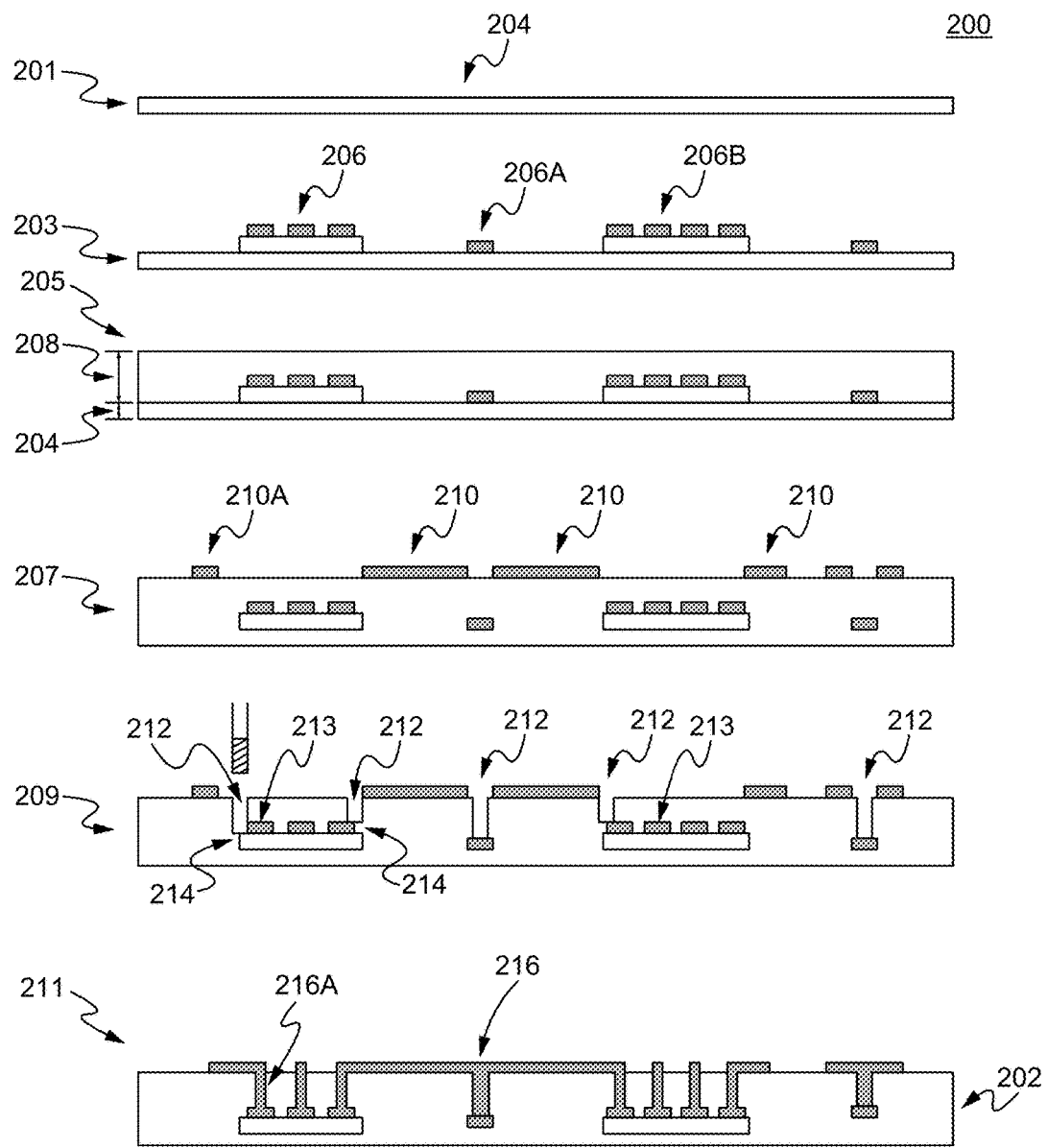
FIG. 2 illustrates a method of making an one layer circuitry in accordance with some embodiments of the present invention.

FIG. 2 illustrates a method 200 of making an one layer circuitry 202 in accordance with some embodiments of the present invention. At Step 201, a first layer of polymeric material 204 is printed with a predetermined thickness, such as 1 micron to sub-millimeters. The thickness of the first layer 204 can be determined by the material strength and flexibility, such as bendable with a human finger force. The printing can be performed using a 3D printer. At Step 203, various electronic components 206 are attached to the first layer 204. The electronic components 206 can be IC chips 206B and die 206A. The attachment can be done by adhesives, such as adhesive for die attachment.

At Step 205, a second layer 208 are printed on top of the first layer 204 and electronic components 206, such that the second layer 208 covers the first layer 204 and the electronic components 206. In some embodiments, the second layer can be distinguishable separated layer from the first layer 204. In some other embodiments, the second layer become an integrated layer with the first layer 204. In some embodiments, a portion of the electronic components are exposed and not covered by the second layer 208. At Step 207, electrically conductive inks 210A are printed on the surface of the second layer 208 to form conductive path patterns 210. At Step 209, holes 212 are drilled to the pads 213 of the components using a laser. At Step 211, metals 216 (such as copper) are deposited in the holes by an electroless process and followed by an electrolytic process to fill the holes forming vias 216A. A person of ordinary skill in the art appreciates that any other methods are able to be used to deposit metals to form the conductive paths. In some embodiments, additional layers (such as $3^{rd}$ and $4^{th}$ layers) are able to be printed to make the shape/contour of the completed device 202.

Figure 3:
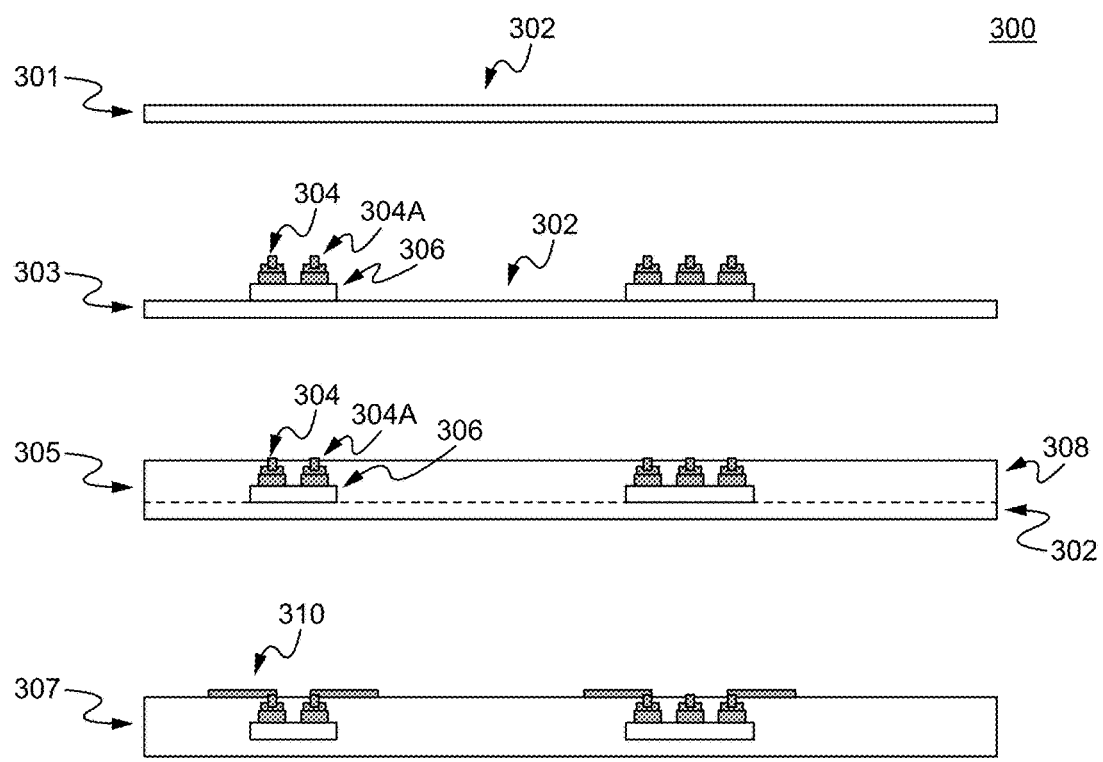
FIG. 3 illustrates a method of making another one layer circuitry in accordance with some embodiments of the present invention.

FIG. 3 illustrates a one layer circuitry manufacturing method 300 in accordance with some embodiments of the present invention. The method 300 can be similar to the method 200, which uses one or more additive printing processes. At Step 301, a first layer 302 is printed using a 3D printer. At Step 303, components 304 with metal stud bumps 304A are attached on the first layer 302. A die attaching adhesive can be used to attach the die 306 to the first layer 302. At Step 305, a second layer 308 is printed on the first layer 302, which covers the components allowing the components to become embedded components while allowing the metal studs 304A exposed to the surface. At Step 307, electrically conductive ink is used to form conductive path pattern 310 on the surface of the second layer 308.

Figure 4:
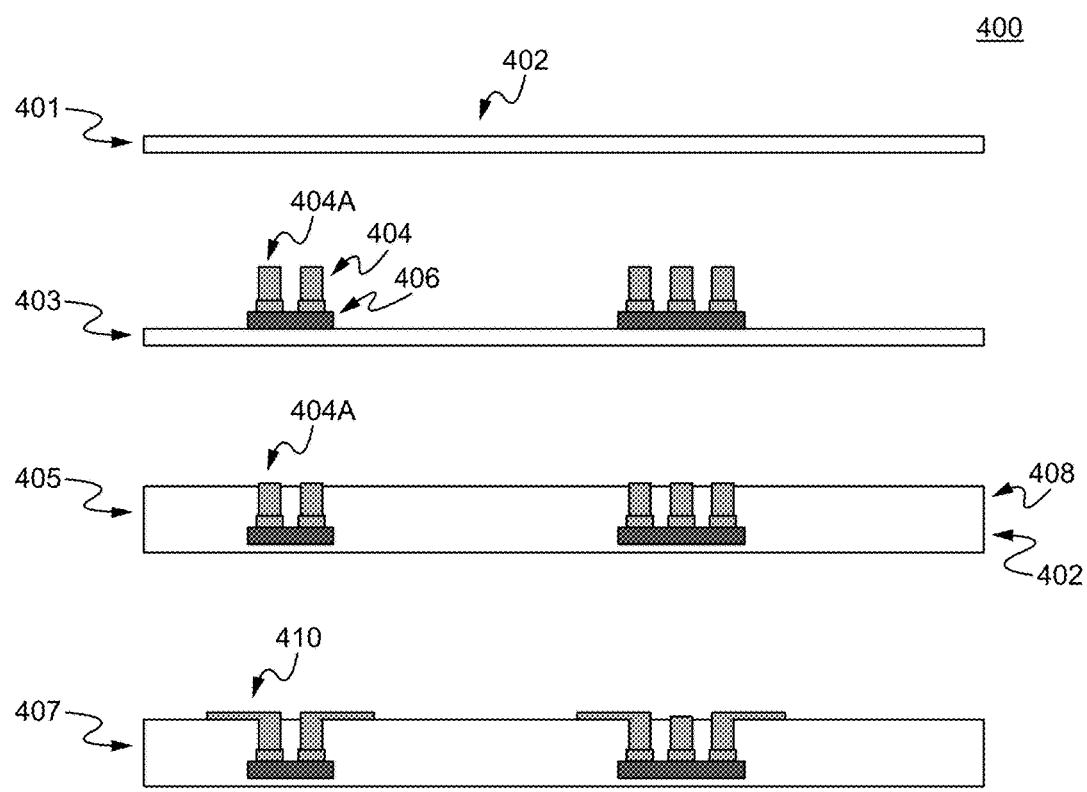
FIG. 4 illustrates a method of making another one layer circuitry in accordance with some embodiments of the present invention.

FIG. 4 illustrates another one layer circuitry manufacturing method 400 in accordance with some embodiments of the present invention. At Step 401, a first layer 402 is printed by using a 3D printer. At Step 403, components 404 with metal pillars 404A are attached on the first layer 402. At Step 405, a second layer 408 is printed on the first layer 402, which covers the components allowing the components to become embedded components while allowing the metal studs 404A exposed to the surface. At Step 407, electrically conductive ink is used to form conductive path pattern 410 on the surface of the second layer 408. Heat, such as laser, light, or UV light, are able to be applied to sinter the metal particles to bond the metal together.

Figure 5:
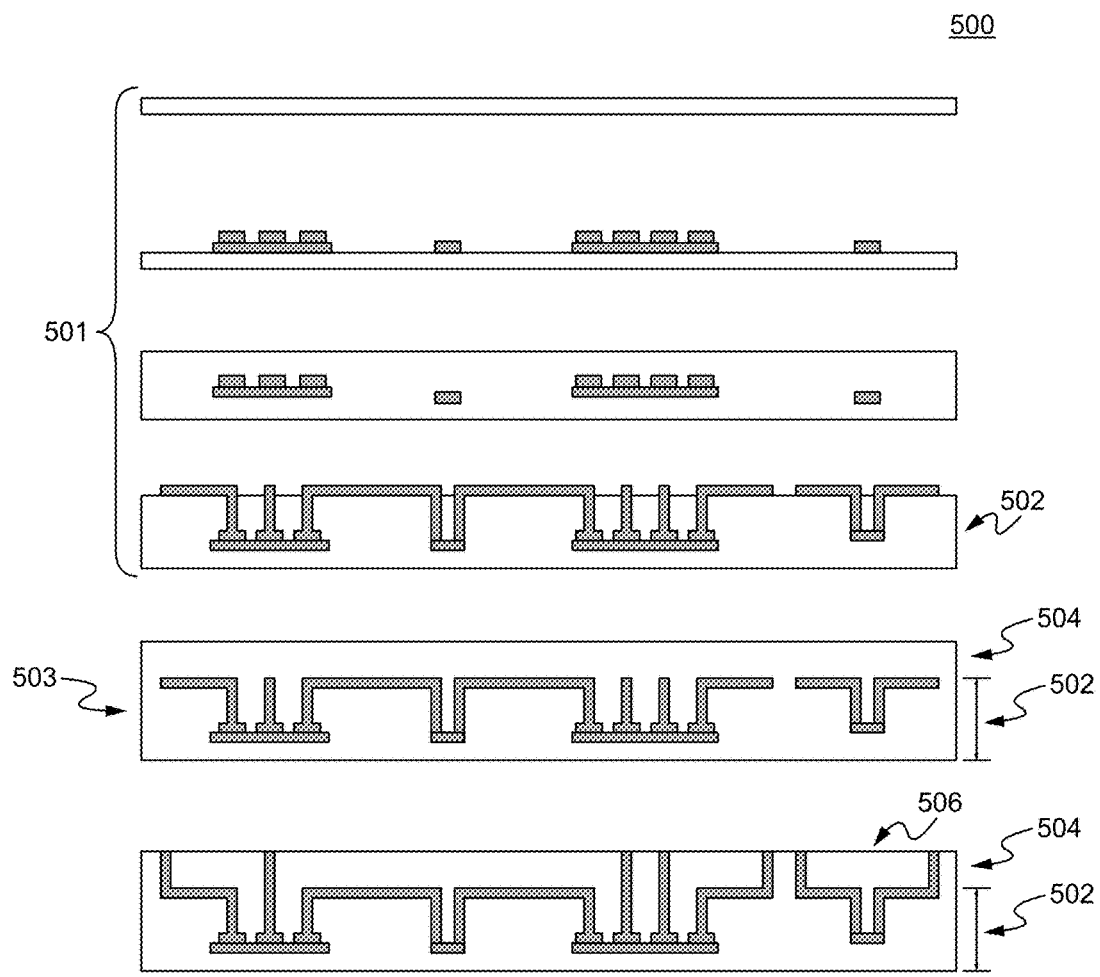
FIG. 5 illustrates a method of making a two layer circuitry in accordance with some embodiments of the present invention.

FIG. 5 illustrates a two layer circuitry 506 manufacturing method in accordance with some embodiments of the present invention. Steps 501 can be the same process like the process of method 200 (FIG. 2), which is used to make a first component layer 502. At Step 503, a second component layer 504 is printed on top of the first component layer 502. The second component layer 504 can be made following the same process like Steps 501. The two layer circuitry 506 can comprise at least two component layers 502 and 504 having independent/completed circuitry in each of the component layers. The component layers 502 and 504 are able to have electronic/signal communications between the two layers. A person of ordinary skill in the art appreciates that more layers of electronic components are within the scope of the present invention.

Figure 6:
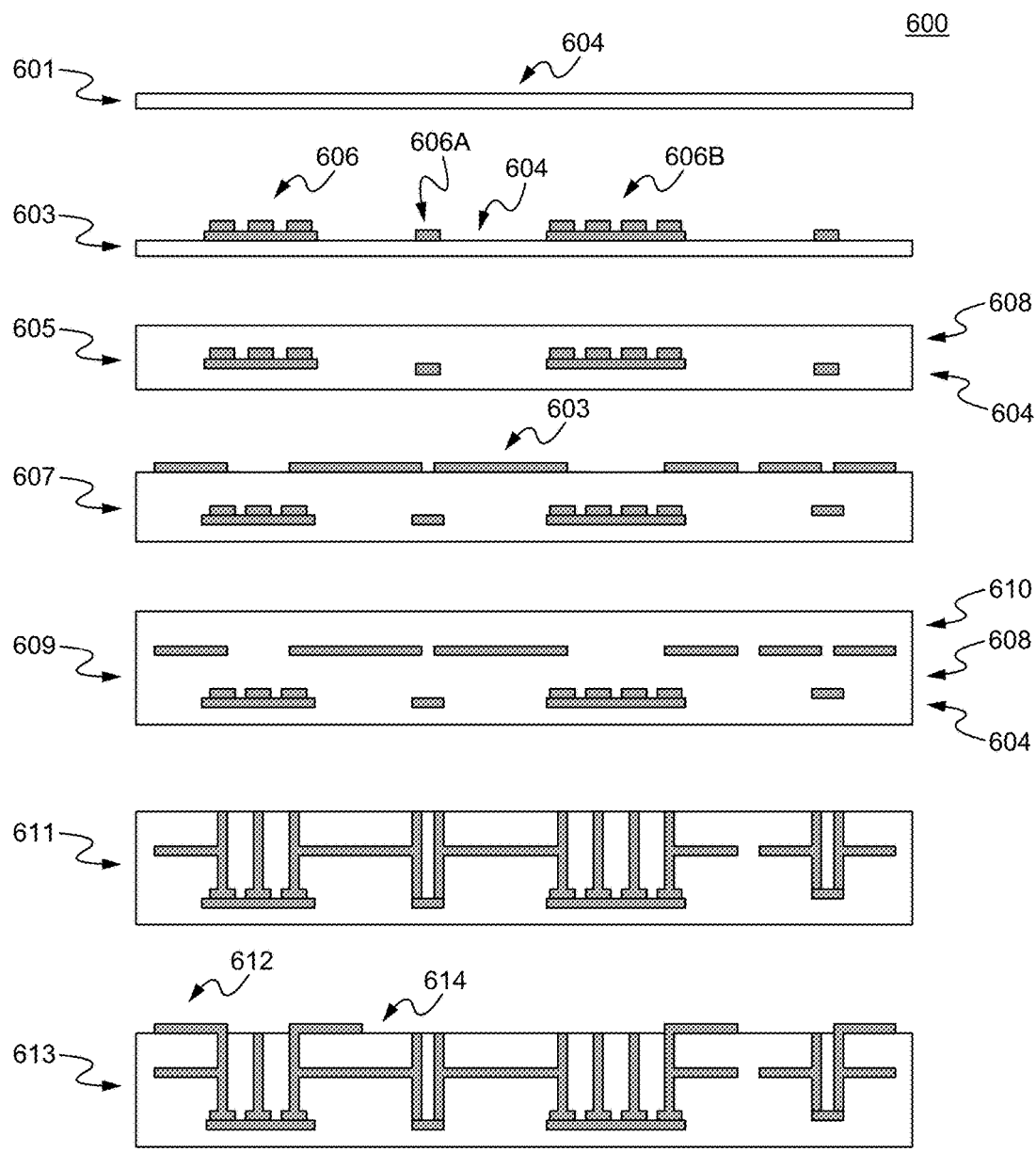
FIG. 6 illustrates a method of making another two layer circuitry in accordance with some embodiments of the present invention.

FIG. 6 illustrates another two layer circuitry making method 600 in accordance with some embodiments of the present invention. At Step 601, a first layer of polymeric material 604 is printed with a predetermined thickness. At Step 603, various electronic components 606 are attached to the first layer 604. The electronic components 606 can be IC chips 606B and die 606A. The attachment can be done by adhesives, such as adhesive for die attachment.

At Step 605, a second layer 608 is printed on top of the first layer 604 and electronic components 606, such that the second layer 608 covers the first layer 604 and the electronic components 606. At Step 607, electrically conductive inks are printed on the surface of the second layer 608 to form conductive path patterns 603.

At Step 609, a third layer of material 610 is printed on top of the second layer of material 608. At Step 611 (similar to Steps 209 and 211 of FIG. 2), drilling is performed, such as using laser, to the pads of the components 606. Next, metals are deposited in the holes. The deposition can be done by using an electroless process and followed by an electrolytic process to fill the holes. A person of ordinary skill in the art appreciates that any other methods are able to be used to deposit the metals, such as CVD (chemical vapor deposition). At Step 613, ink printing is used to form one or more conductive path patterns 612 on the top layer surface 614.

Figure 7:
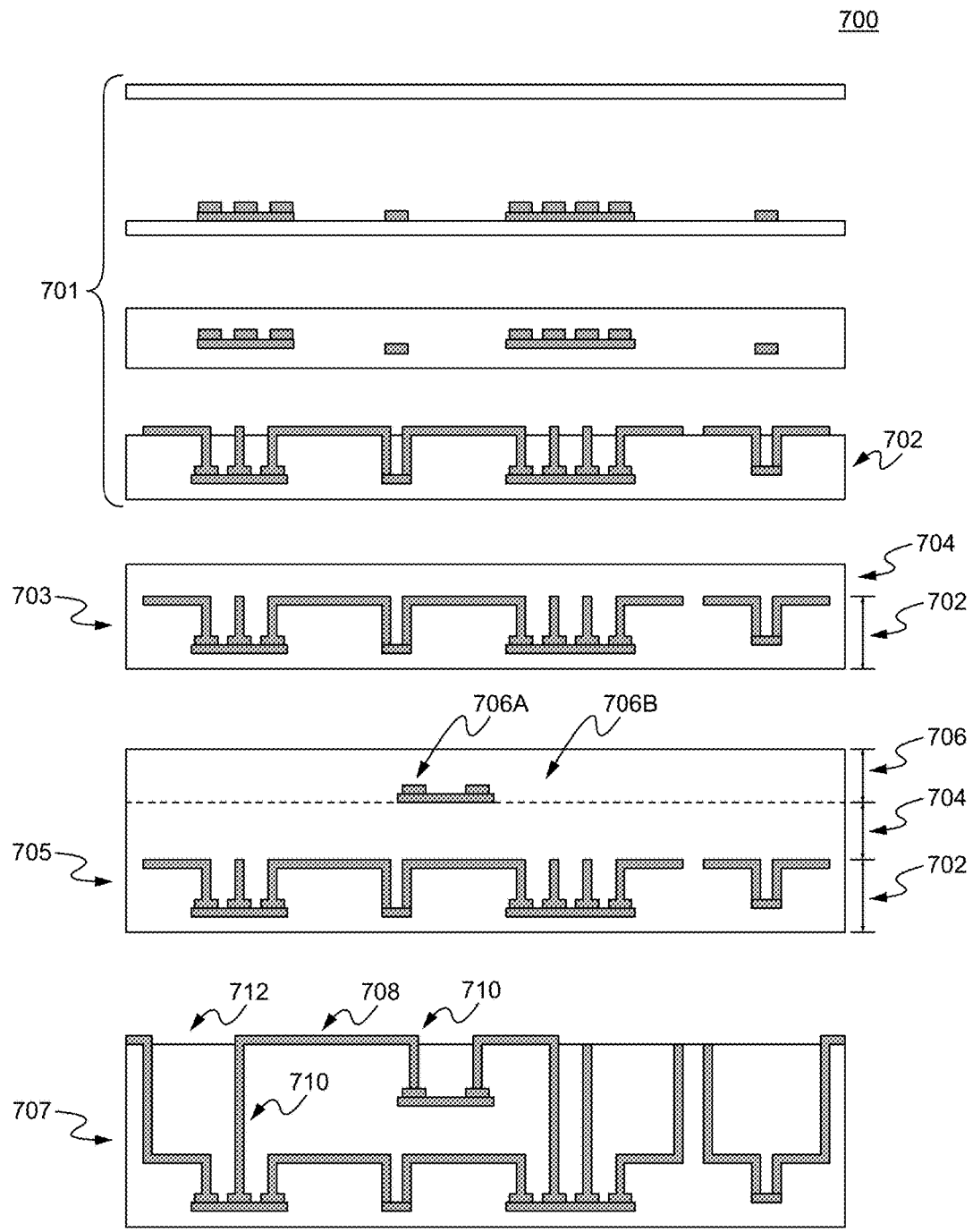
FIG. 7 illustrates a method of making a multiple layer circuitry in accordance with some embodiments of the present invention.

FIG. 7 illustrates a multiple layer circuitry making method 700 in accordance with some embodiments of the present invention. Steps 701 that make a first component layer 702 can be the same as the procedures described in the method 200 (FIG. 2). At Step 703, a second polymer layer 704 is printed on top of the first component layer 702. At Step 705, electronic components 706A are attached to the second polymer layer 704. A third polymer layer 706B is printed on top to enclose the electronic components 706A and forming a second component layer 706. At Step 707, ink printing is used to form conductive paths 708 on a top surface 712. Drilling and depositing are performed to fill holes and form conductive paths 710. A completed circuitry is formed by using the steps described above. The two component layers can be separated by a polymeric layer without components, and connections between the two component layers can be subsequently made by drilling and depositing metals or conductors.

Figure 8:
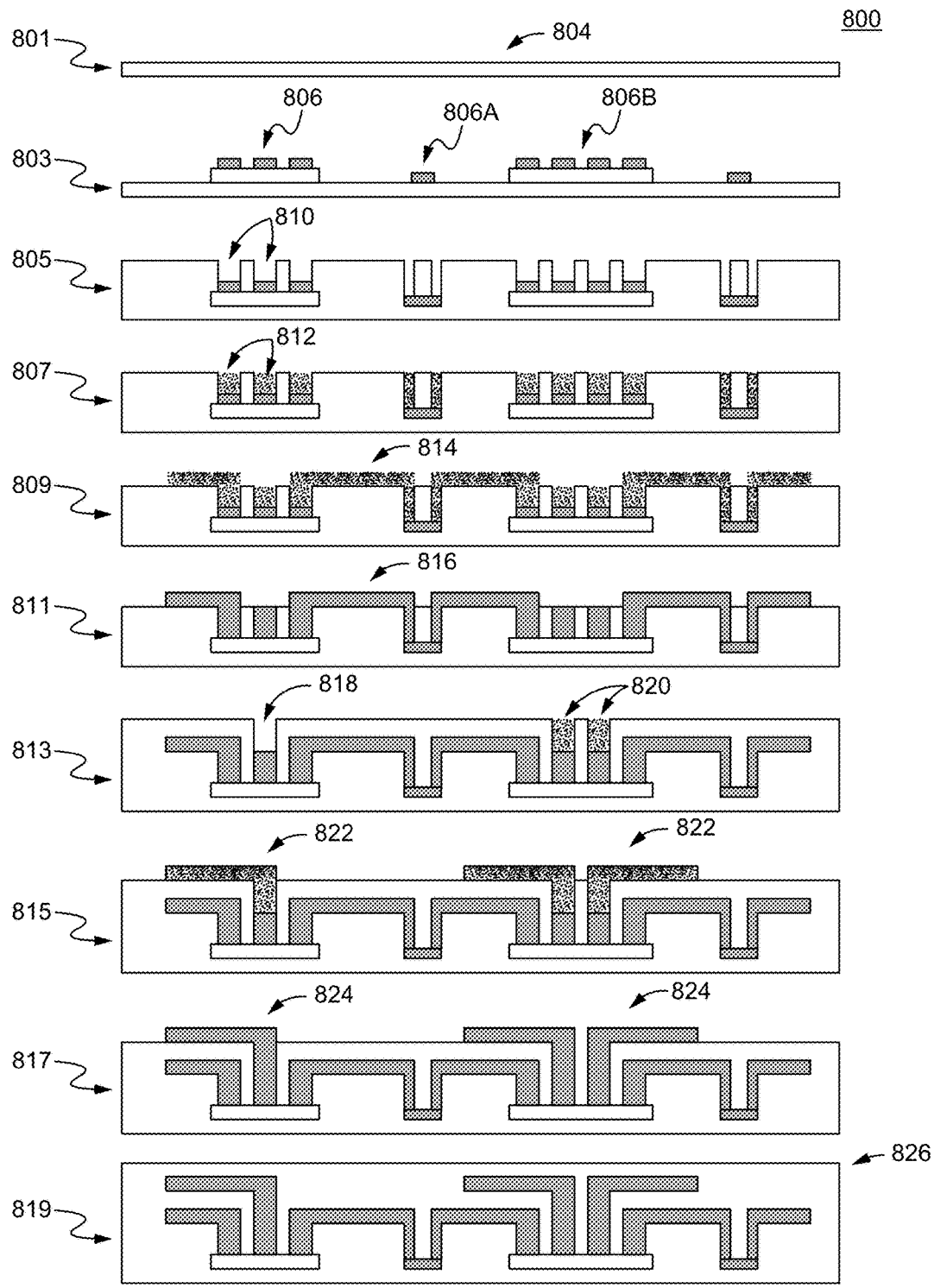
FIG. 8 illustrates a method of making a circuit board with both insulation and circuit layer simultaneously in accordance with some embodiments of the present invention.

FIG. 8 illustrates a circuit board making method 800 with making both insulation and circuit layer simultaneously in accordance with some embodiments of the present invention. At Step 801, a first layer of polymeric material 804 is printed with a predetermined thickness. At Step 803, various electronic components 806 are attached to the first layer 804. The electronic components 806 can be IC chips 806B and die 806A. A person of ordinary skill in the art appreciates that any other electronic components are able to be attached to the polymeric material 804. At Step 805, polymeric materials are further layer-by-layer printed, such that predetermined or all electronic components 806 are imbedded inside. In some embodiments, predetermined areas of pads are left out forming holes 810. In other embodiments, the holes 810 are formed by 3D printing the polymeric material over the entire area and subsequently laser drilling to form the holes. In some other embodiments, the holes 810 are formed by 3D printing the polymeric material over the entire area and subsequently dissolving the polymeric material by using a suitable solvent. For example, water is used to dissolve a water soluble polymeric material and organic solvent (such as DMF) is used to dissolve an organic solvent soluble polymeric material. At Step 807, the holes 810 are filled with one or more pastes or inks of nano-metal particles and forming nanoparticles filled holes 812.

At Step 809, predetermined/predesigned circuitry 814 is printed on the surface of the polymeric material with paste or ink of nano-metal particles. At Step 811, the paste or ink of nanoparticles are sintered by using a laser or with heat reflow to form a sintered circuitry 816. At Step 813, another layer of insulating polymer are printed and left predetermined holes 818 (e.g., not printing a insulating polymer). The holes 818 are filled with nanoparticles forming filled holes 820. At Step 815, nanoparticles on the surface layer are printed to form conducing circuitry 822. At Step 817, the nanoparticles on the surface layer are sintered to form sintered circuitry 824. At Step 819, further layers of insulating polymers are printed to form a product 826.

Figure 9:
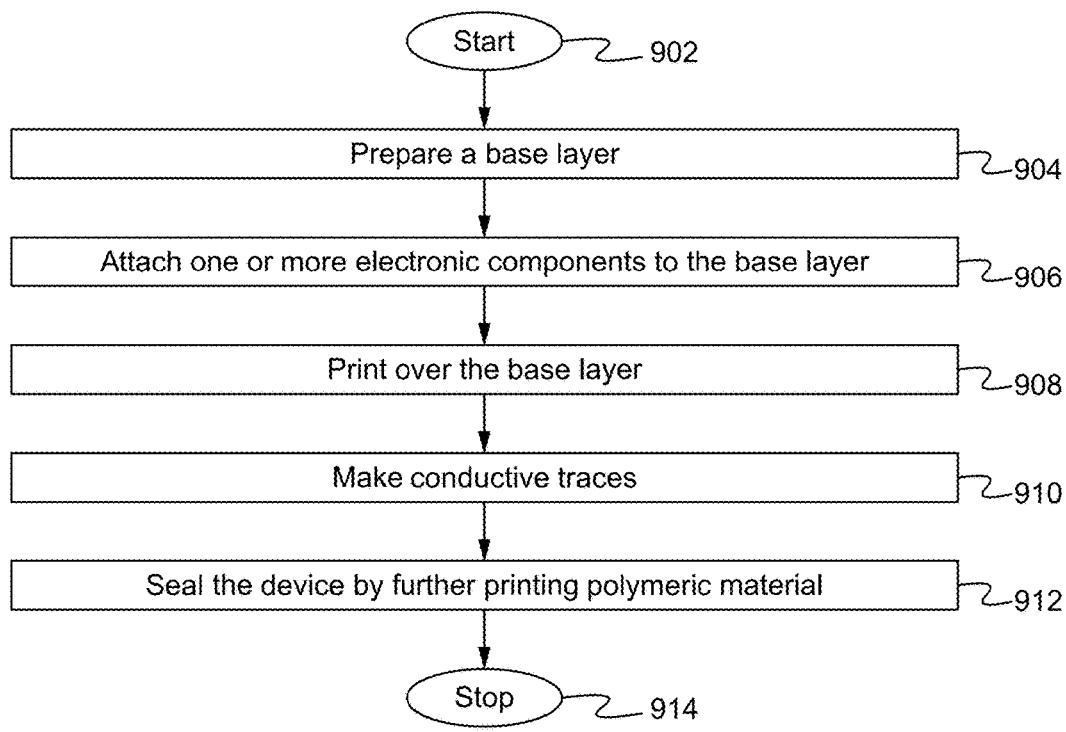
FIG. 9 is a flow chat illustrating a method of making an electronic device using 3D printing with embedded electronic components in accordance with some embodiments of the present invention.

FIG. 9 illustrates an electronic device making method 900 using 3D printing with embedded electronic components in accordance with some embodiments of the present invention. The method 900 can start at Step 902. At Step 904, a base layer is prepared. The base layer can be printed by a 3D printer or acquired as a commercially available substrate. At Step 906, one or more electronic components, such as IC, transistor, capacitor, resister, and/or a DC/AC motor is attached to the base layer. At Step 908, further layers of the polymeric materials are printed over the base layer and enclose the electronic components. At Step 910, conductive traces are made for making signal transmitting paths. Various conducting traces are able to be included using the methods described in the present specification. At Step 912, the device is sealed by further printing polymeric materials, which can serve as a protective layer for the device. Method 900 is able to stop at Step 914.

In the following, several processes of forming vias (through hole or microvias) and interconnection between components through 3D printing are disclosed. In some embodiments, the method comprises forming via holes on the components pads through printing process; filling electrically conductive ink; printing ink on the surface with one or more predesigned patterns; heating at a localized area, by a laser beam, or by UV; sintering the ink; and forming conductive interconnection between components' pads. In other embodiments, the method comprises printing water soluble polymers on the components pads (forming polymer column); forming microvias through dissolution of the polymer after the completion of the printing process for each layer circuitry; printing conductive ink on the layer surface and into the via holes; heating with a heater or laser beam; sintering the ink; and forming conductive interconnection between components' pads.

In some other embodiments, the method comprises printing water soluble polymers on the components pads (forming polymer column); forming microvia through dissolution of the polymer; print conductive ink on the layer surface; heating locally and applying a laser beam; sintering the inks; electroless plating on the via holes; electrolytic plating to fill the microvia (at the same time, the ink printed trace can also be plated); and forming conductive interconnection between the components' pads.

In some other embodiments, the method comprises incorporating bump components with metal studs (such as metal deposition, or through wire bonding technique) including printing polymers, layer-by-layer, to the same height as the metal studs; printing conductive ink on the layer surface and into the via holes; heating locally with a heater or a laser beam; sintering the inks; and forming conductive interconnection between components' pads (such as for enhancing the conductivity). In some embodiments, electrolytic plating can be employed to cover more metal (such as copper) on the sintered interconnect.

In some other embodiments, the method comprises adding copper foil on the whole layer surface (copper foil can be used with thin adhesives to enhance adhesion between copper and printing materials) during the printing process; drilling holes using a laser; electrolysis plating; electrolytic plating to fill the via; etching the top copper based on a design pattern through photo-resisting lithography; and continue printing and repeat the above process. In some embodiments, the method comprises forming via holes on the components' pads via 3D printing; chemically treating the polymer to make it electroless platable; electroless plating on the polymer surface and via holes; applying photoresist; exposing the photoresist to UV light based on circuit pattern (exposed photoresist can be harden); removing non-exposed photoresist; electroplating the metals on the whole surface and filling in the via; stripping away remaining photoresist and etching away the background electroless copper; and forming interconnect.

In some other embodiments, the method comprises melting metal particles and spraying them on the components pads during the 3D printing process; building up to form filled conductive vias; spraying metal on the surface to form conductive traces; and forming conductive interconnect between components pads. In some other embodiments, the method comprises printing the main body of polymers layer-by-layer with via holes (e.g., not electroless platable polymers); printing another polymer on the layer surface based on the designed circuit pattern (e.g., electroless platable polymers); electroless plating (e.g., the surface as well as the via hole); electrolytic plating; and forming conductive interconnect between components pads.

The term "printing" used throughout the present specification can include using a 3D printer to print the predetermined object. The printing can be performed layer by layer or by thread by thread depends on the type of 3D printer used. A person of ordinary skill in the art appreciates that any types of 3D printers are able to be used herein.

3D printing is a form of additive manufacturing technology where a three dimensional object is formed by laying down successive layers of materials. A 3D printer can be connected to a computer and print out a 3 dimensional object based on a 3D model created and/or stored in the computer. 3D printers used herein can include Stereolithography (SLA), Selective Laser Sintering (SLS), Direct Metal Laser Sintering (DMLS), and Fused Deposition Modeling (FDM). Products made by using the devices and methods described above can include memory stick, and RFID. Nanoparticles used herein can include silver, copper, nickel, carbon particles. Particles in micron sizes, nano-flakes, nano-tubes are all within the scope of the present invention. The printing using of a 3D printer can print any predetermined thickness and pattern. The 3D printer is able to print angled shape to create an angled surface device.

In some embodiments, the base layer or the first printed layer described above includes ABS filled with ceramic particles for higher strength and copper plates (as heat spreader or product chassis plate). In some embodiments, the heat spreader can be embedded inside he product in any position during the printing process. The copper plate can be plated with nickel/gold, polymer or anodized for protection. The die/chip attachment can be done by using epoxy, such as silver filled epoxy. The metal pod described above can include copper, nickel/gold finish. The holes left by printing described above includes via holes, such as microvials. Conductive paths can include interconnects. The polymeric materials used of the 3D printer can include photosensitive resin or silicone. The 3D printing described herein is able to use single or different polymers (such as mixed 2 types of polymers). The polymers disclosed herein can be mixed with other materials to provide various functionality, such as mixing ceramic powders to enhance mechanical strength or electrical performance. All the materials disclosed herein can be either printed or dispensed. The conductive inks disclosed herein can include micro- and/or nano-metal-particles (such as silver, copper, nickel, silver plated copper, and gold), and nanotubes, which are able to be mixed with resins and solvents. The conductive interconnects can be made through conductive ink, conductive paste, conductive adhesive, or pure metal particles. After sintering through heat, UV, or laser (LDS process, laser direct structuring), the conductive interconnects can be further electroplated to enhance electrical conductivity. The ink or paste can be printed through various methods, including inkjet printing, aerosol jet printing, or screening printing.

To utilize the present invention, the methods and devices disclosed herein can be used for rapid prototyping, which can be used to rapidly converting a concept design into real products. The methods and devices disclosed herein provide advantageous aspects, including embedding electronic components into complex and irregular shapes and avoid complex processes; making functional products by embedding in all the components; using an additive process to avoid material waste; using a solderless process avoiding high temperature reflow; embedding multiple layer circuitry/ multiple layer components; embedding various functional components (such as cooling structure with liquid cooling, heat sink, high speed cable and optical fibers); allowing fast manufacturing to market; and avoiding NRE (non-recurring engineering) tooling.

In operation, electronic components are attached to a base plate, 3D printing is used to print a predetermined shape, and holes are drilled and filled by predetermined processes.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A method of making an electronic board comprising:
   a. coupling one or more discrete electronic components to a base layer; and b. additive printing around and on the one or more electronic components after coupling the one or more electronic components to the base layer, wherein additive printing forms an insulating layer over the one or more electronic components, wherein the insulating layer has one or more holes formed by the additive process, the one or more holes extending through the insulating layer to a surface of each electronic component.

2. The method of claim 1, wherein the additive printing comprises 3D printing.

3. The method of claim 1, wherein the base layer is formed by using the additive printing.

4. The method of claim 1, wherein the base layer is formed by layer-by-layer printing.

5. The method of claim 1, wherein the electronic components comprise one or more computing chips.

6. The method of claim 1, wherein the coupling comprises attaching using an adhesive.

7. The method of claim 1, further comprising forming a conductive path pattern.

8. The method of claim 7, wherein the conductive path pattern is formed by printing.

9. The method of claim 8, wherein the printing comprises using an electrically conductive ink.

10. The method of claim 1, further comprising depositing metals in the one or more holes after the one or more holes are formed.

* * * * *